(12) United States Patent
Confalonieri et al.

(10) Patent No.: US 7,425,857 B2
(45) Date of Patent: Sep. 16, 2008

(54) TIME-DELAY CIRCUIT

(75) Inventors: Pierangelo Confalonieri, Caponago (IT); Marco Zamprogno, Cesano Maderno (IT); Federico Garibaldi, Arcore (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 63 days.

(21) Appl. No.: 11/055,564

(22) Filed: Feb. 9, 2005

(65) Prior Publication Data
US 2005/0195010 A1    Sep. 8, 2005

(30) Foreign Application Priority Data

| Feb. 10, 2004 | (EP) | ................................. 04425083 |
| Feb. 18, 2004 | (EP) | ................................. 04425100 |

(51) Int. Cl.
H03H 11/26    (2006.01)
(52) U.S. Cl. .................... 327/264; 327/284
(58) Field of Classification Search .......... 327/264
See application file for complete search history.

(56) References Cited

U.S. PATENT DOCUMENTS

| 4,550,405 A |    | 10/1985 | West ........................ 371/1 |
| 4,565,976 A |    | 1/1986  | Campbell ................. 331/57 |
| 4,893,095 A |    | 1/1990  | Thommen ................. 331/57 |
| 5,038,118 A |    | 8/1991  | Langenkamp ............ 331/57 |
| 5,357,204 A |    | 10/1994 | Knoll ....................... 328/62 |
| 5,416,436 A |    | 5/1995  | Rainard .................... 327/270 |
| 5,592,126 A |    | 1/1997  | Boudewijns et al. ...... 331/45 |
| 5,841,707 A | *  | 11/1998 | Cline et al. ............... 365/194 |
| 5,923,715 A | *  | 7/1999  | Ono .......................... 375/376 |
| 6,060,930 A | *  | 5/2000  | Choi ......................... 327/276 |
| 6,229,367 B1| *  | 5/2001  | Choudhury ................ 327/276 |
| 6,362,694 B1|    | 3/2002  | Doberenz .................. 331/57 |

(Continued)

FOREIGN PATENT DOCUMENTS

EP    0 901 226 A2    3/1999

(Continued)

OTHER PUBLICATIONS

U. Tietze, Ch. Schenk, "Halbleiter-Schaltungstechnik 10.Auflage," Springer Verlag 561846, pp. 232-236, 1993. XP002288569.

Primary Examiner—Kenneth B. Wells
Assistant Examiner—Ryan C Jager
(74) Attorney, Agent, or Firm—Lisa K. Jorgenson; Timothy L. Boller; Seed IP Law Group PLLC

(57) ABSTRACT

A time delay logic comprises a first stage with an inverter, a capacitor connected to the input terminal of the inverter, a constant current generator and an electronic switch controlled by an input pulse. The capacitor begins to charge at a predetermined edge of the input pulse and brings the input terminal of the inverter from a first voltage (ground) to the switching threshold voltage of the inverter, so that on the output terminal of the inverter there is obtained a pulse having an edge that, as referred to the predetermined edge of the input pulse, has a delay time that depends on the inverter threshold. The circuit comprises a second stage, coupled with the first, that is a dual circuit of the circuit of the first stage and has an inverter equal to the one of the first stage.

26 Claims, 10 Drawing Sheets

U.S. PATENT DOCUMENTS

| | | | |
|---|---|---|---|
| 6,373,342 B1 | 4/2002 | Tran | 331/57 |
| 6,388,490 B2 * | 5/2002 | Saeki | 327/270 |
| 6,603,339 B2 | 8/2003 | Atallah et al. | 327/175 |
| 2002/0021159 A1 * | 2/2002 | Takahashi | 327/283 |
| 2002/0027465 A1 * | 3/2002 | Yoshikawa | 327/277 |
| 2005/0231293 A1 * | 10/2005 | Confalonieri et al. | 331/57 |
| 2005/0231412 A1 * | 10/2005 | Confalonieri et al. | 341/155 |

FOREIGN PATENT DOCUMENTS

| | | |
|---|---|---|
| JP | 62-76317 | 4/1987 |
| JP | 5-304441 | 11/1993 |
| JP | 8-102643 | 4/1996 |

* cited by examiner

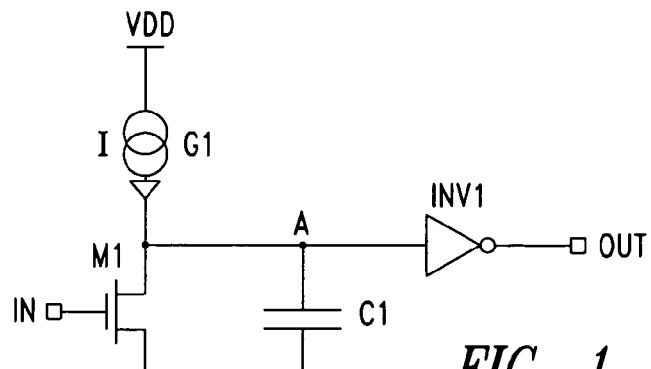
FIG. 1
(Prior Art)
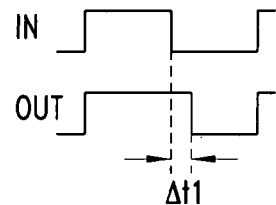
FIG. 2
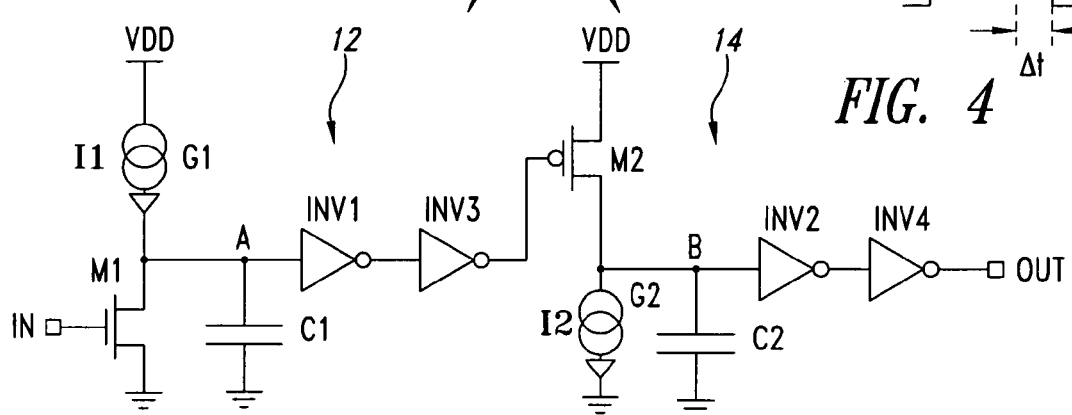
FIG. 3
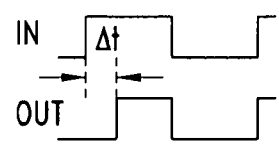
FIG. 4
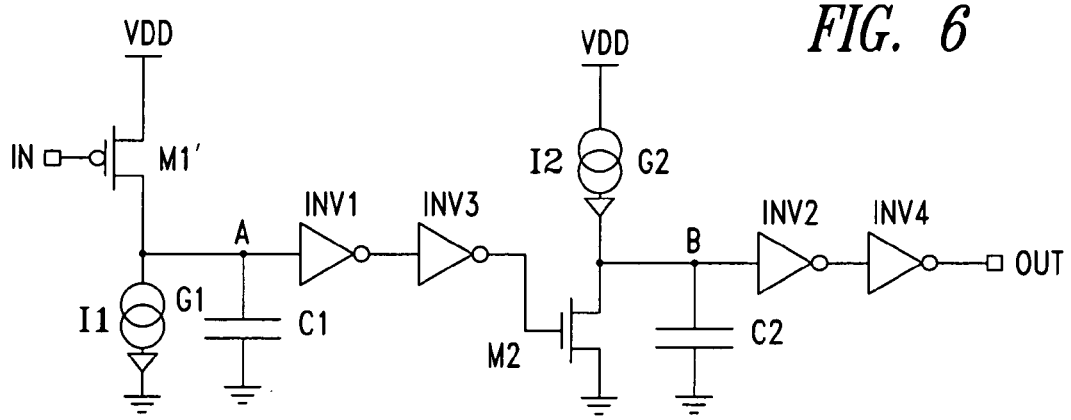
FIG. 5
FIG. 6

| Vth/Vdd | ΔVth/Vdd [%] | Δdelay [%] |
|---|---|---|
| 0.300 | 40.000 | 12.5769 |
| 0.350 | 30.000 | 6.8031 |
| 0.400 | 20.000 | 2.9447 |
| 0.425 | 15.000 | 1.6416 |
| 0.450 | 10.000 | 0.7250 |
| 0.475 | 5.000 | 0.1806 |
| 0.500 | 0.000 | 0.0000 |
| 0.525 | 5.000 | 0.1806 |
| 0.550 | 10.000 | 0.7250 |
| 0.575 | 15.000 | 1.6416 |
| 0.600 | 20.000 | 2.9447 |
| 0.650 | 30.000 | 6.8031 |
| 0.700 | 40.000 | 12.5789 |

TIME-DELAY CIRCUIT

BACKGROUND OF THE INVENTION

1. Field of the Invention

The present disclosure relates to integrated circuits and, more particularly, to time-delay circuits.

2. Description of the Related Art

In the design of integrated circuits there is often felt the need for generating digital signals that are retarded with respect to an edge of a digital input signal and to determine the time delay in an analog manner.

In prior art there are known circuits that respond to a predetermined edge of a binary digital input signal, i.e. to a transition from one of the predetermined binary logic states to the other, with a delay Δt that is a function of the ratio between a capacitance C and a current I. A time-delay circuit of this type in which the transition from 1 to 0 is retarded is schematically illustrated in FIG. 1; it comprises a capacitor C1 connected to the input of an inverter INV1 and means for controlling the charge of the capacitor. These means comprise a controlled electronic switch in the form of an N-channel MOS transistor, indicated by M1, and a constant current generator G1 that are connected, in series with each other, between the terminals (VDD and ground) of a voltage supply source. More particularly, transistor M1 has its source terminal connected to ground and its drain terminal, i.e. the node A in the figure, connected to the generator G1. The input terminal IN and the output terminal OUT of the time-delay circuit are, respectively, the gate terminal of the transistor M1 and the output terminal of the inverter INV1.

Also known is the dual circuit of the one shown in FIG. 1, namely a circuit that utilizes a P-channel MOS transistor having its source terminal connected to the positive terminal VDD of the supply source and its drain terminal connected, via a constant current generator, to the negative terminal of the supply source and, via a capacitor, to the positive terminal of the supply source.

As far as the biasing of the capacitor is concerned, the terminal opposite to the one connected to the inverter input can be maintained at any desired potential.

A likewise known variant of the time-delay circuit of FIG. 1 is shown in FIG. 7. In this circuit the constant current generator G1 is substituted by a resistor R1, so that the time delay is a function of the product of the resistance of the resistor R1 multiplied by the capacitance of the capacitor C1.

Referring to FIG. 2, let us consider as input signal IN of the circuit of FIG. 1 a clock signal, i.e. a periodic succession of voltage pulses that vary in steps between a low value, ground potential for example (binary state 0), and a given positive voltage, VDD for example (binary state 1). When IN=1, the transistor M1 is conducting, so that the connection node A between the drain terminal of M1 and the generator G1 is substantially at ground potential (binary state 0), the capacitor C1 is discharged and, due to the effect of the inverter INV1, the output OUT of the delay circuit is a positive voltage, typically the supply voltage VDD. When the input signal IN passes from 1 to 0, the transistor M1 stops conducting and the capacitor C1 commences charging through the generator G1. When the voltage on the node A reaches the threshold voltage that makes the inverter switch, the output OUT of the time-delay circuit passes from the voltage VDD to ground potential. The time Δt1 that elapses between the moment the trailing edge of the signal IN changes from 1 to 0 and the switching of the inverter, i.e. the delay time of the circuit, obviously depends not only on the current I of the generator G1 and the capacitance of the capacitor C1, but also on the threshold voltage of the inverter INV1. The inverter is typically constituted by two complementary MOS transistors (i.e. an N-channel transistor and a P-channel transistor) that have a common drain terminal, while their source terminals are connected, respectively, to the ground terminal and the positive terminal VDD of the supply source. In this case the threshold voltage depends on the supply voltage VDD, the threshold voltages of the transistors and the mobility of the charge carriers (electrons and vacancies) of the transistors. The supply voltage VDD may be fixed with a good degree of precision (+/−1%) at a nominal value established in the design phase, but the threshold voltages of the transistors and the mobility of the charge carriers cannot be accurately fixed, because they depend on manufacturing parameters, which may vary within relatively wide limits, and depend also on the operating temperature, which—in its turn—depends on the operating conditions of the device in which the time-delay circuit is integrated. According to the prior art, if these difficulties are to be at least partially avoided, the designer has to adopt some rather complex measures that, for this very reason, go to the detriment of the simplicity of the circuit and occupy a not by any means negligible area of the integrated circuit.

BRIEF SUMMARY OF THE INVENTION

In one aspect, a time-delay circuit, simple in structure and capable of being integrated in a small area, generates a delay substantially insensitive to the variation of the manufacturing parameters and the operating temperature of the integrated circuit.

In another aspect, a time-delay circuit comprises: an input terminal and an output terminal; a first inverter having a switching threshold voltage; a first capacitor connected to an input terminal of the first inverter; means for controlling a charge of the first capacitor capable of responding to a predetermined edge of a pulse applied to the input terminal of the circuit by bringing the input terminal of the first inverter from a first predetermined voltage to the switching threshold voltage and obtaining on an output terminal of the first inverter a pulse having an edge that, as referred to the predetermined edge of the input pulse, has a first delay time that depends on the switching voltage threshold; a stage having: an input terminal coupled to the output terminal of the first inverter and an output terminal coupled to the output terminal of the circuit, said stage comprising: a second inverter having a switching threshold voltage substantially equal to that of the first inverter and an output terminal that is the output terminal of the stage; a second capacitor connected to the input terminal of the second inverter; and means for controlling the charge of the second capacitor capable of responding to the retarded edge of the pulse present on the output terminal of the first inverter by bringing the input terminal of the second inverter from a second predetermined voltage to the switching threshold voltage and obtaining on the output terminal of the second inverter a pulse having an edge that, as referred to the retarded edge of the output pulse of the first inverter, has a second delay time that depends on the switching threshold voltage, an overall delay of the circuit being a sum of the first and the second delay time.

In another aspect, a time delay logic comprises: a first stage having: a first inverting logic; and means for triggering a delayed response of the first inverting logic to an input signal; and a second stage having: a second inverting logic; and means for triggering a delayed response of the second inverting logic to an output of the first stage.

In another aspect, a method of producing a delayed response to an edge of an input signal comprises: charging a first capacitor in response to the edge of the input signal; triggering a first inverting logic when the charge on the first capacitor reaches a first threshold; discharging a second capacitor in response to the triggering of the first inverting logic; and triggering a second inverting logic when the charge on the second capacitance falls to a second threshold.

In another aspect, a method of producing a delayed response to an edge of an input signal, comprises: discharging a first capacitor in response to the edge of the input signal; triggering a first inverting logic when the charge on the first capacitor falls to a first threshold; charging a second capacitor in response to the triggering of the first inverting logic; and triggering a second inverting logic when the charge on the second capacitance reaches a second threshold.

In another aspect, a time delay element comprises: a first time-delay stage having: a first node; a first inverter having an input coupled to the first node; a first capacitor coupled between the first node and a first reference voltage; and a first transistor coupled to the first node and having a control terminal to receive an input signal; and a second time-delay stage having: a second node; a second inverter having an input coupled to the second node; a second capacitor coupled between the second node and the first reference voltage; and a second transistor coupled to the second node and having a control terminal coupled to an output of the first time-delay stage.

BRIEF DESCRIPTION OF THE SEVERAL VIEWS OF THE DRAWINGS

The invention will be more clearly understood from the following detailed descriptions of some embodiments thereof, the description making reference to the attached drawings, of which:

FIG. 1 shows a time-delay circuit in accordance with the prior art;

FIG. 2 shows the input and output waveforms of the circuit of FIG. 1;

FIG. 3 shows an embodiment of a time-delay logic in accordance with the invention;

FIG. 4 shows the input and output waveforms of the embodiment of FIG. 3;

FIG. 5 shows another embodiment of a time-delay logic in accordance with the invention;

FIG. 6 shows the input and output waveforms of the embodiment of FIG. 5;

DETAILED DESCRIPTION OF THE INVENTION

Figure 7:
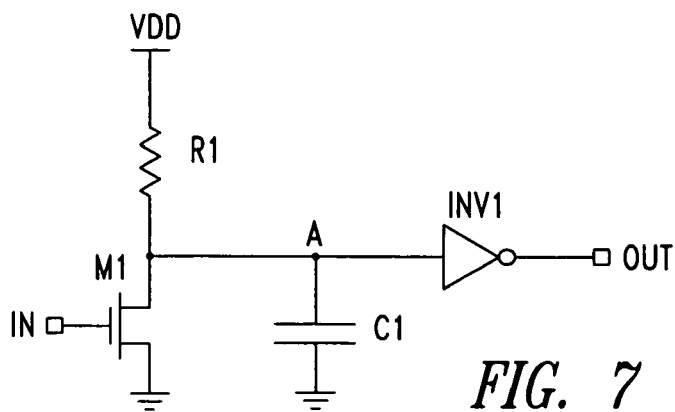
FIG. 7 shows a time-delay circuit in accordance with the prior art.

Referring to FIGS. 3 and 4, the time delay circuit 10 in accordance with an embodiment of the invention comprises an input stage 12, similar to the circuit of FIG. 1, that is coupled, by means of an inverter INV3, to a second stage 14 that comprises a dual or complementary circuit of the one of FIG. 1. More particularly, the second stage 14 comprises a P-channel MOS transistor, indicated by M2, having its source terminal coupled to the positive terminal VDD of the supply source and its drain terminal (node B) coupled, via a constant current generator G2, to the negative terminal of the supply source, i.e. the ground terminal. The node B is coupled to ground via a capacitor C2 and to the output terminal OUT of the circuit via two inverters INV2 and INV4 in cascade.

Referring now also to FIG. 4, when the input terminal IN is equal to 1, the transistor M1 is conducting, the node A is at 0, the capacitor C1 is discharged, the output of the inverter INV1 is at 1, the output of the inverter INV3 is at 0, the transistor M2 is conducting, the node B is at 1, the capacitor C2 is charged at the voltage VDD, the output of the inverter INV2 is at 0 and the output OUT is at 1. When the input IN switches from 1 to 0, i.e. when M1 passes from conducting to blocking, the current I1 of the generator G1 charges the capacitance C1, causing the voltage of the node A to rise linearly (VA=I$1*t$/C1, where t is the time and C1 is the capacitance of the capacitor C1). When, following a time Δt1, the threshold voltage of the inverter INV1 is attained, the output of the inverter switches from 1 to 0, the output of the inverter INV3 switches from 0 to 1, the transistor M2 switches to blocking and the capacitor C2 becomes linearly discharged (VB=VDD−I$2*t$/C2, where t is the time, C2 is the capacitance of the capacitor C2 and I2 is the current of the generator G2). When, following a time Δt2, the node B reaches the threshold voltage of the inverter INV2, the latter switches from 0 to 1 and the output OUT switches from 1 to 0. The time Δt that elapses between the moment the trailing edge of the signal IN changes from 1 to 0 and the switching of the inverter INV4 is the delay time of the circuit and is substantially given by the sum of the two delays Δt1 and Δt2, i.e. the sum of the time that is needed for the current I1 to charge the capacitor C1 from 0 (ground potential) to the threshold voltage Vth (INV1) of the inverter INV1 and the time that is needed for the current I2 to discharge the capacitor C2 from the voltage VDD to the threshold voltage Vth(INV2) of the inverter INV2. When the circuit is designed in such a manner that I1=I2=I, C1=C2=C, Vth (INV1)=Vth(INV2), the total delay time of the circuit is determined solely by the time needed for a constant current I to charge a capacitor of capacitance C from 0 to VDD. The delay time is thus independent of the threshold voltage of the inverters and therefore insensitive to the variations deriving from the manufacturing process and the temperature. There remains the dependence on the supply voltage, but, as already mentioned, this can easily be maintained at a substantially constant nominal value.

The conditions of equality indicated above can be obtained with a good degree of precision. In particular, the generators G1 and G2 may be constituted by branches of respective equal current mirrors that mirror a fixed reference current independent of the temperature and the inverters INV1, INV2, INV3, INV4 may be constituted by identical components. For example, they may be of the same size and may be made by means of the same manufacturing process. The same result may, as a general rule, be obtained with different current generators, capacitors and inverters, provided that the equalities I1/C1=I2/C2 and Vth(INV1)=Vth(INV2) are substantially satisfied.

The inverter INV4 serves for obtaining at the output terminal a clock signal having the same sign as the input signal. When a clock signal of the opposite sign is desired, this inverter may be omitted: in that case the output of the circuit coincides with the output of the inverter INV2.

FIG. 5 shows a dual or complementary delay circuit 20 of the embodiment shown in FIG. 3. It differs from this latter circuit by virtue of the fact that, rather than an N-channel MOS transistor, it utilizes a P-channel MOS transistor, indicated in the figure by M1', and, rather than a P-channel MOS transistor, an N-channel transistor, indicated by M2', and also by virtue of the fact that these transistors have their respective source terminals connected to the supply terminals dual or complementary to those of the corresponding transistors of the circuit of FIG. 3. With this configuration the delay time $\Delta t$ of the output OUT is relative to the leading edge of the input signal IN, as is shown in FIG. 6. The functioning of this circuit is analogous to the functioning of the circuit of FIG. 3, for which reason it will not here be further described.

Figure 8:
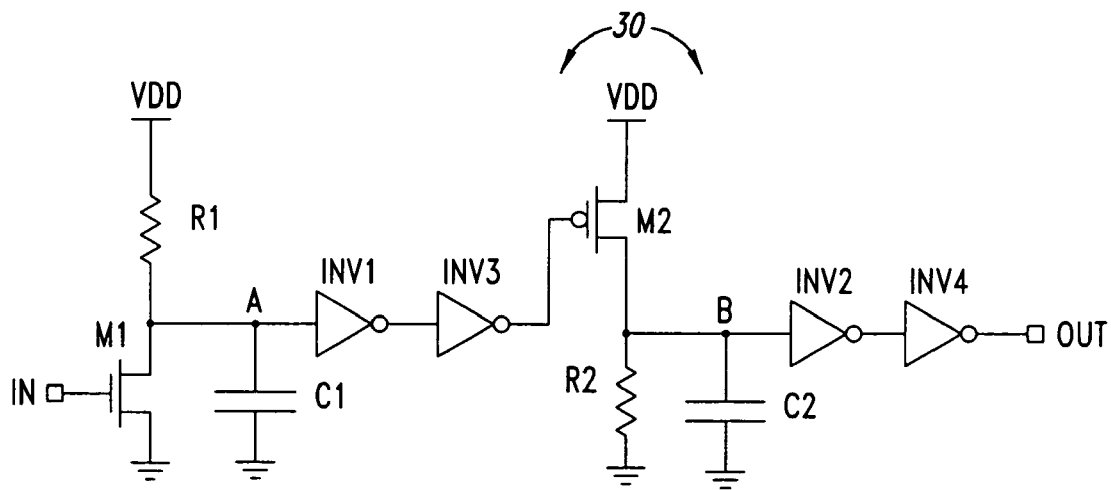
FIG. 8 shows a further embodiment of a time-delay logic in accordance with the invention.
Figure 9:
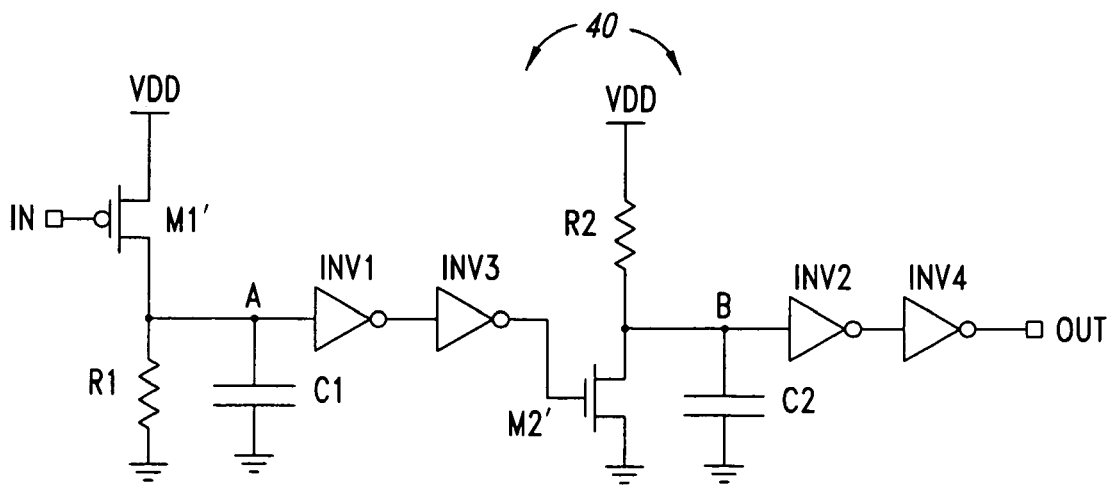
FIG. 9 shows a further embodiment of a time-delay logic in accordance with the invention.

The circuits of FIGS. 8 and 9 differ from those of FIGS. 3 and 5, respectively, by virtue of the fact that the constant current generators G1 and G2 are substituted by two resistors, respectively R1 and R2. In this case, once again, the delay time is given by the sum of the delays of the two stages, each of which is a function of the product R1C1 and R2C2 of the respective resistances and capacitances.

The delay logic 30 of FIG. 8 produces a delay with respect to the trailing edge and the delay logic 40 of FIG. 9 produces a delay with respect to the leading edge like the circuits of, respectively, FIG. 3 and FIG. 4 and as shown, respectively, in FIG. 4 and FIG. 6.

Figures 10, 11:
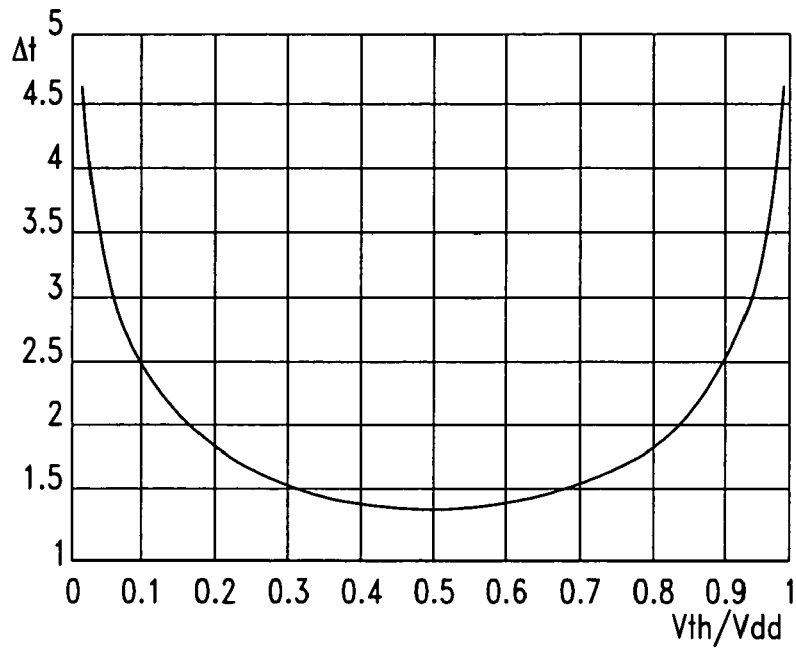
FIG. 10 shows a graph that illustrates the operation of the circuits of FIGS. 8 and 9.
FIG. 11 shows a table that illustrates the operation of the embodiments of FIGS. 8 and 9.

Since the voltage of the capacitors C1, C2 varies in an exponential manner in time when the capacitors become charged and discharged, the delays generated in the two stages are equal to each other only when the threshold voltages of the two inverters are equal to half the supply voltage. In that case, in fact, the time needed to charge the capacitor C1 from 0 to VDD/2 and to discharge the capacitor C2 from VDD to VDD/2 will be the same when R1=R2 and C1=C2. The threshold voltages can be fixed at the nominal value VDD/2 during the design phase. In actual practice, nevertheless, the threshold voltages may differ within wide limits from the nominal value on account of the variability of the manufacturing parameters, and the delay times generated in the two stages may therefore differ from each other. As a general rule, therefore, the compensation obtained will not be complete and the total delay time, given by the sum of the two delays, depends to some extent on the effective threshold voltage. It can easily be shown, however, that this compensation will nevertheless be very substantial within a very wide range of variability of the threshold voltage. This conclusion can be verified by examining the curve of FIG. 10 in combination with the table of FIG. 11, where Vth/Vdd indicates the ratio between the threshold voltage Vth and the supply voltage Vdd, $\Delta t$ indicates the total delay time, $\Delta$Vth/Vdd[%] indicates the percentage variation of the ratio Vth/Vdd and $\Delta$delay[%] indicates the percentage variation of the total delay.

Figure 12:
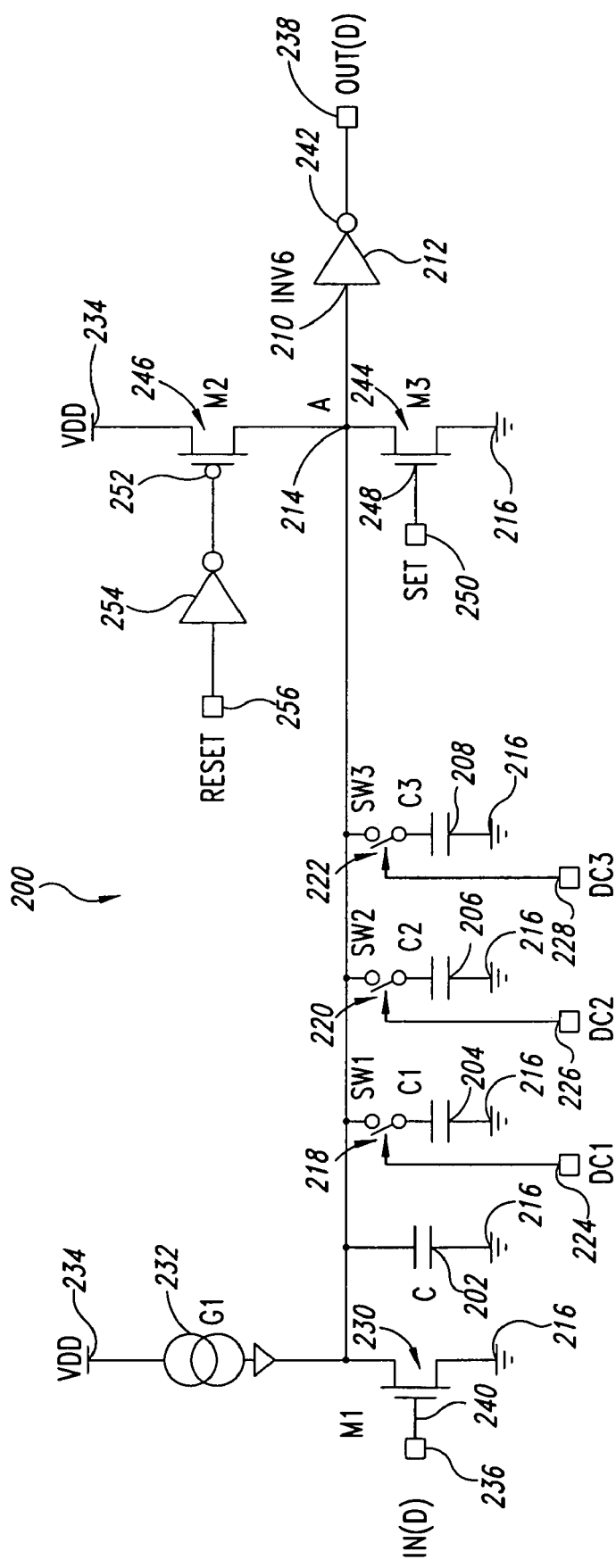
FIG. 12 shows a time-delay circuit in accordance with the prior art.

Another known delay element 200, in which the transition from 1 to 0 is delayed and in which this delay can be adjusted, is schematically illustrated by FIG. 12. It comprises a group of capacitors 202, 204, 206, 208 (four in this example, but they could also be more or less than four) connected, or capable of being connected, to the input A 210 of an inverter INV6 212. The capacitors 202, 204, 206, 208 are connected between the node A 214 and ground 216; more precisely, one of them, indicated by C 202, is connected directly between the node A and ground and the other three, indicated by C1 204, C2 206, C3 208, can be connected to the node A 214 via respective electronic switches SW1 218, SW2 220 and SW3 222 controlled by binary logic signals applied to respective control terminals DC1 224, DC2 226, DC3 228. An N-channel MOS transistor, indicated by M1 230, and a constant current generator G1 232 connected in series with each other between the terminals of the supply source (ground 216 and VDD 234) make it possible to control the charge of the capacitors 202, 204, 206, 208. The input terminal IN(D) 236 and the output terminal OUT(D) 238 of the delay circuit 200 are, respectively, the control or gate terminal 240 of the transistor M1 230 and the output terminal 242 of the inverter INV6 212. The node A 214, via an N-channel MOS transistor 244, indicated by M3, is also connected to ground 216, and, via a P-channel MOS transistor 246, indicated by M2, to the supply terminal VDD 234. The gate terminal 248 of the transistor M3 244 is connected to an activation terminal SET 250 of the delay circuit 200 and the gate terminal 252 of the transistor M2 246, via an inverter 254, is connected to a deactivation terminal RESET 256 of the delay circuit 200.

According to a likewise known variant (not illustrated) of the delay circuit of FIG. 12, the constant current generator G1 232 is replaced by a resistor, so that the delay is a function of the product of the resistance of the resistor multiplied by the capacitance of the capacitors 202, 204, 206, 208 connected to the input 210 of the inverter 212.

Referring to the circuit of FIG. 12, let us first consider the case in which SET=0 and RESET=0, i.e., the case in which both M3 244 and M2 246 are not conducting. When IN(D)=1, the transistor M1 230 conducts, so that the node A 214 is substantially at ground potential (binary state 0), the capacitors (i.e., 202, 204, 206, 208) connected to the node A 214 are discharged and, due to the effect of the inverter INV6 212, the output 238 OUT(D) of the delay circuit is a positive voltage, typically the supply voltage VDD (binary state 1). When the input signal IN(D) passes from 0 to 1, the transistor M1 230 ceases to conduct and the capacitors 202, 204, 206, 208 begin to charge through the generator G1 232. When the voltage at the node A 214 attains the switching threshold voltage of the inverter INV6 212, the output 238 OUT(D) of the delay circuit 200 passes from the supply voltage VDD to ground potential. The time that elapses between the moment when the signal IN passes from 1 to 0 and the switching instant of the inverter, i.e., the delay time of the circuit 200, obviously depends on the threshold voltage of the inverter 212. The delay time may be modified by closing or opening one or more of the switches SW1 218, SW2 220, SW3 222 connecting the capacitors C1 204, C2 206, C3 208 to ground 216 by means of signals applied to DC1 224, DC2 226, DC3 228. The output OUT(D) 238 of the delay circuit 200 may be forced to 1 or to 0 by using the alternative settings of RESET=0 and SET=1 or RESET=1 and SET=0.

The inverter INV6 212 typically consists of two complementary MOS transistors (i.e., an N-channel transistor and a P-channel transistor) that have their drain terminals in common and their source terminals connected, respectively, to the ground terminal 216 and the positive terminal VDD 234 of the supply source. In this case the threshold voltage depends on the supply voltage VDD, the threshold voltages of the transistors and the mobility of the charge carriers (electrons and vacancies) in the transistors. The supply voltage VDD may be fixed with a good degree of precision (+/−1%) at a nominal value established in the design phase, but the threshold voltages of the transistors and the mobility of the charge carriers cannot be accurately fixed, because they depend on manufacturing parameters, which may vary within relatively wide limits, and depend also on the operating temperature, which—in its turn—depends on the operating conditions of the device in which the time-delay circuit is integrated.

Figure 13A:
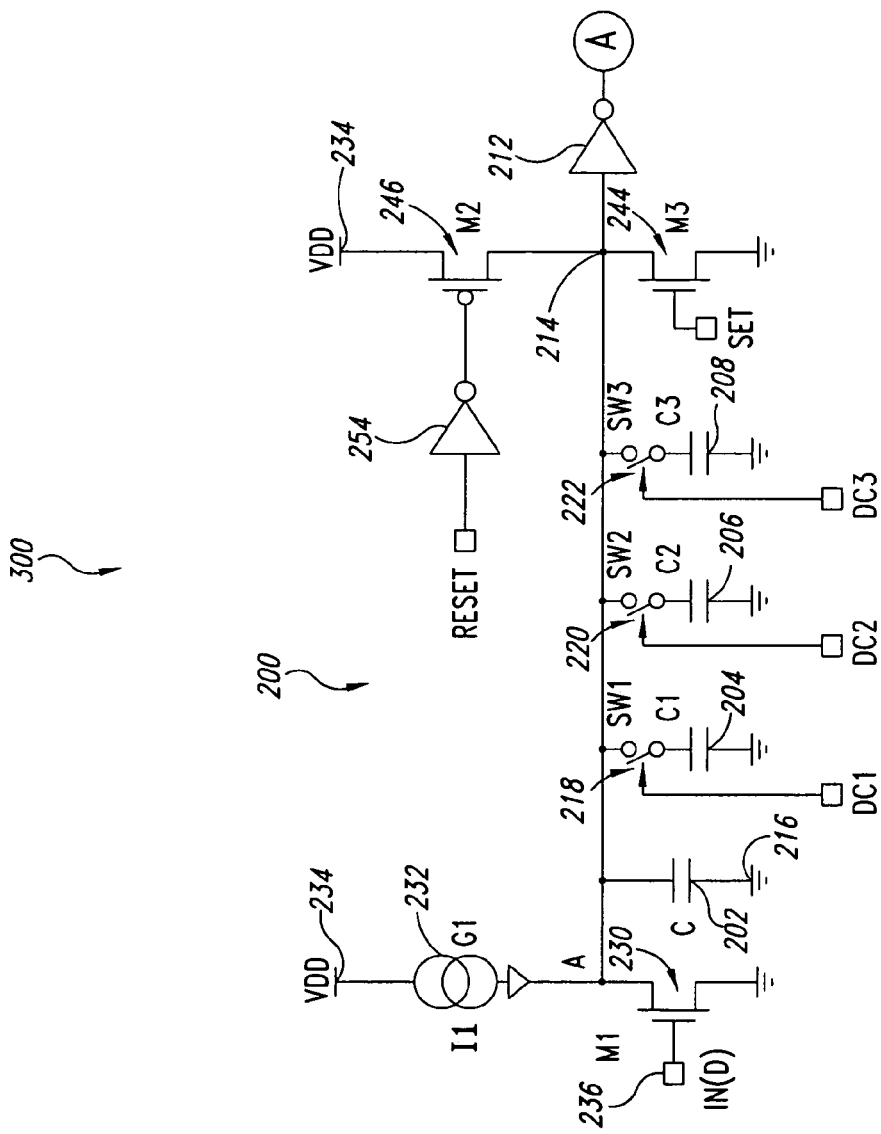
FIGS. 13A and 13B show a further embodiment of a time-delay circuit in accordance with the invention.
Figure 13B:
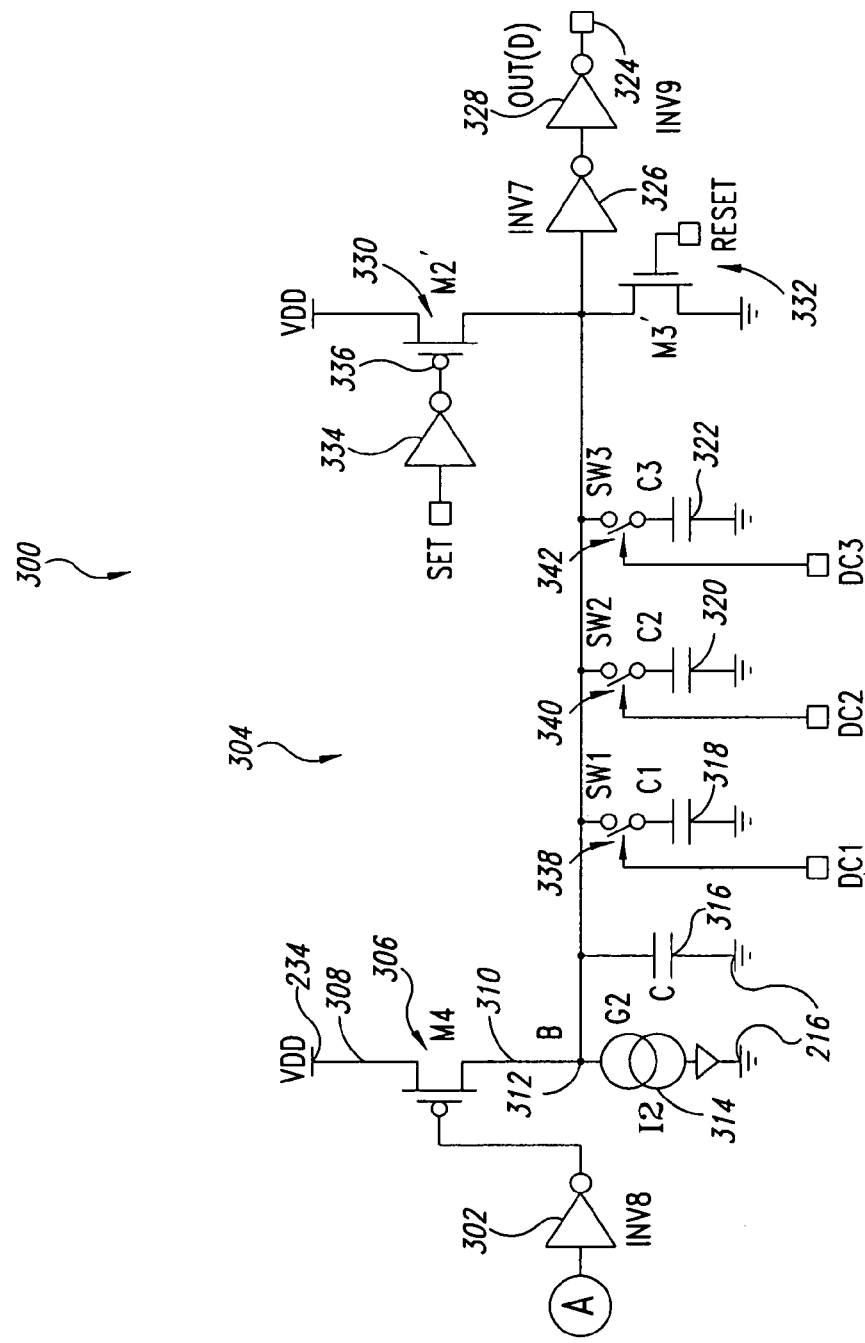

With a view to avoiding these difficulties, use may be made of the circuit shown in FIG. 13. The delay element 300 shown in FIGS. 13A and 13B (collectively, FIG. 13) comprises an input stage 200 similar to the circuit of FIG. 12, that is coupled, by means of an inverter INV8 302, to a second stage 304 that comprises a dual or complimentary circuit of the one of FIG. 12. More particularly, the second stage 304 comprises a P-channel MOS transistor 306, indicated by M4, having its source terminal 308 connected to the positive terminal VDD 234 of the supply source and its drain terminal 310 (node B 312) connected, via a constant current generator G2 314, to the negative terminal 216 of the supply source, i.e., the ground terminal. The node B 312 is connected to ground via an array of capacitors 316, 318, 320, 322, that are equal to the capacitors of the input stage, and to the output terminal OUT(D) 324 of the circuit 300 via two inverters INV7 326 and INV9 328 in cascade. Two complementary MOS transistors M2' 330 and M3' 332, equal to the transistors M2 246 and M3 244 of the first stage 200, are connected to the node B 312 to perform the same function as the transistors M2 246 and M3 244, with the sole difference that the signals SET and RESET are swapped. An inverter 334 is coupled to the control terminal or gate 336 of transistor M2' 330. The delay time may be modified by closing or opening one or more of the switches 338, 340, 342 coupling the capacitors 318, 320, 322 to the node B 312.

When the input terminal IN(D) 236 is equal to 1 (with SET=0 and RESET=0), the transistor M1 230 is conducting, the node A 214 is at 0, the capacitors (i.e., 202, 204, 206, 208) connected to the node A are discharged, the output of the inverter INV6 212 is at 1, the output of the inverter INV8 302 is at 0, the transistor M4 306 is conducting, the node B 312 is at 1, the capacitors (i.e., 316, 318, 320, 322) connected to the node B 312 are charged at the voltage VDD, the output of the inverter INV7 326 is at 0 and the output OUT(D) 324 is at 1. When the input IN(D) 236 switches from 1 to 0, i.e., when M1 230 passes from conducting to blocking, the current I1 of the generator G1 232 charges the capacitors (i.e., 202, 204, 206, 208) connected to the node A 214, causing the voltage of the node A 214 to rise linearly (VA=I1*t/C1), where t is the time and CA is the capacitance of the capacitors). When, following a time Δt1, the threshold voltage of the inverter INV6 212 is attained, the output of the inverter INV6 212 switches from 1 to 0, the output of the inverter INV8 302 switches from 0 to 1, the transistor M4 306 switches to blocking and the capacitors (i.e., 316, 318, 320, 322) connected to the node B 312 become linearly discharged (VB=VDD−I2*t/CB, where t is the time, CB is the capacitance of the capacitors and I2 is the current of the generator G2 314). When, following a time Δt2, the node B 312 reaches the threshold voltage of the inverter INV7 326, the latter switches from 0 to 1 and the output OUT(D) 324 switches from 1 to 0. The time Δt that elapses between the moment the signal IN(D) 236 changes from 1 to 0 and the switching of the inverter INV9 328 is the delay time of the circuit 300 and is substantially given by the sum of the two delays Δt1 and Δt2, i.e., the sum of the time that is needed for the current I1 to charge the capacitors connected to the node A 214 from 0 (ground potential) to the threshold voltage Vth(INV6) of the inverter INV6 212 and the time that is needed for the current I2 to discharge the capacitors connected to the node B 312 from the voltage VDD to the threshold voltage Vth(INV7) of the inverter INV7 326. When the circuit 300 is designed in such a manner that I1=I2=I, CA=CB=C, Vth (INV6)=Vth(INV7), the total delay time of the circuit is determined solely by the time needed for a constant current I to charge a capacitor of capacitance C from 0 to VDD. The delay time is thus independent of the threshold voltage of the inverters and therefore insensitive to the variations deriving from the manufacturing process and the temperature. There remains the dependence on the supply voltage, but, as already mentioned, this can easily be maintained at a substantially constant nominal value.

The conditions of equality indicated above can be obtained with a good degree of precision. The generators G1 and G2 may, for example, be constituted by branches of respective equal current mirrors that mirror a fixed reference current independent of the temperature and the inverters may be constituted by identical components, since they are of the same size and are made by means of the same manufacturing process. The same result may, as a general rule, be obtained with different current generators, capacitors and inverters, provided that the equalities I1/CA=I2/CB and Vth(INV6)=Vth(INV7) are substantially satisfied.

The inverter INV9 328 serves for obtaining at the output terminal a clock signal having the same sign as the input signal. When a clock signal of the opposite sign is desired, this inverter may be omitted: in that case the output of the circuit coincides with the output of the inverter INV7 326.

A dual circuit (not here illustrated) of the one shown in FIG. 13 utilizes a P-channel MOS transistor rather than an N-channel MOS transistor and an N-channel MOS transistor rather than a P-Channel MOS transistor; these transistors have their respective source terminals connected to the supply terminals dual to those of the corresponding transistors of the circuit of FIG. 13. With this configuration the delay time Δt of the output is relative to the leading edge of the input signal rather than the trailing edge. The functioning of this circuit is analogous to the functioning of the circuit 300 of FIG. 13, for which reason it will not here be further described.

The circuit 300 of FIG. 13 and its dual can be modified, as already noted in relation to the circuit of FIG. 12, by including two resistors in place of the constant current generators G1 and G2. In this case, once again, the delay time will be given by the sum of the delay times of the two stages, each of which is a function of the respective resistances and capacitances.

Figure 14A:
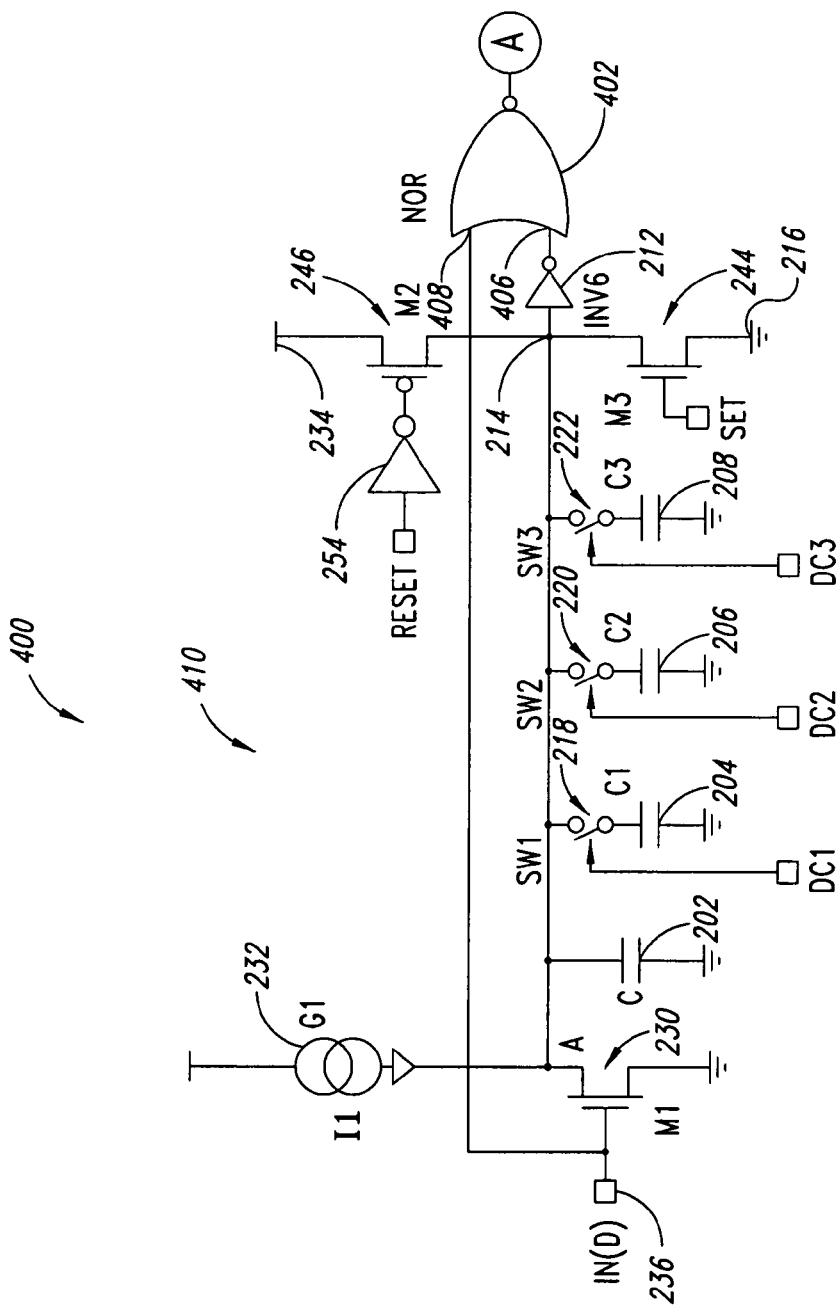
FIGS. 14A and 14B show a further embodiment of a time-delay circuit in accordance with the invention.
Figure 14B:
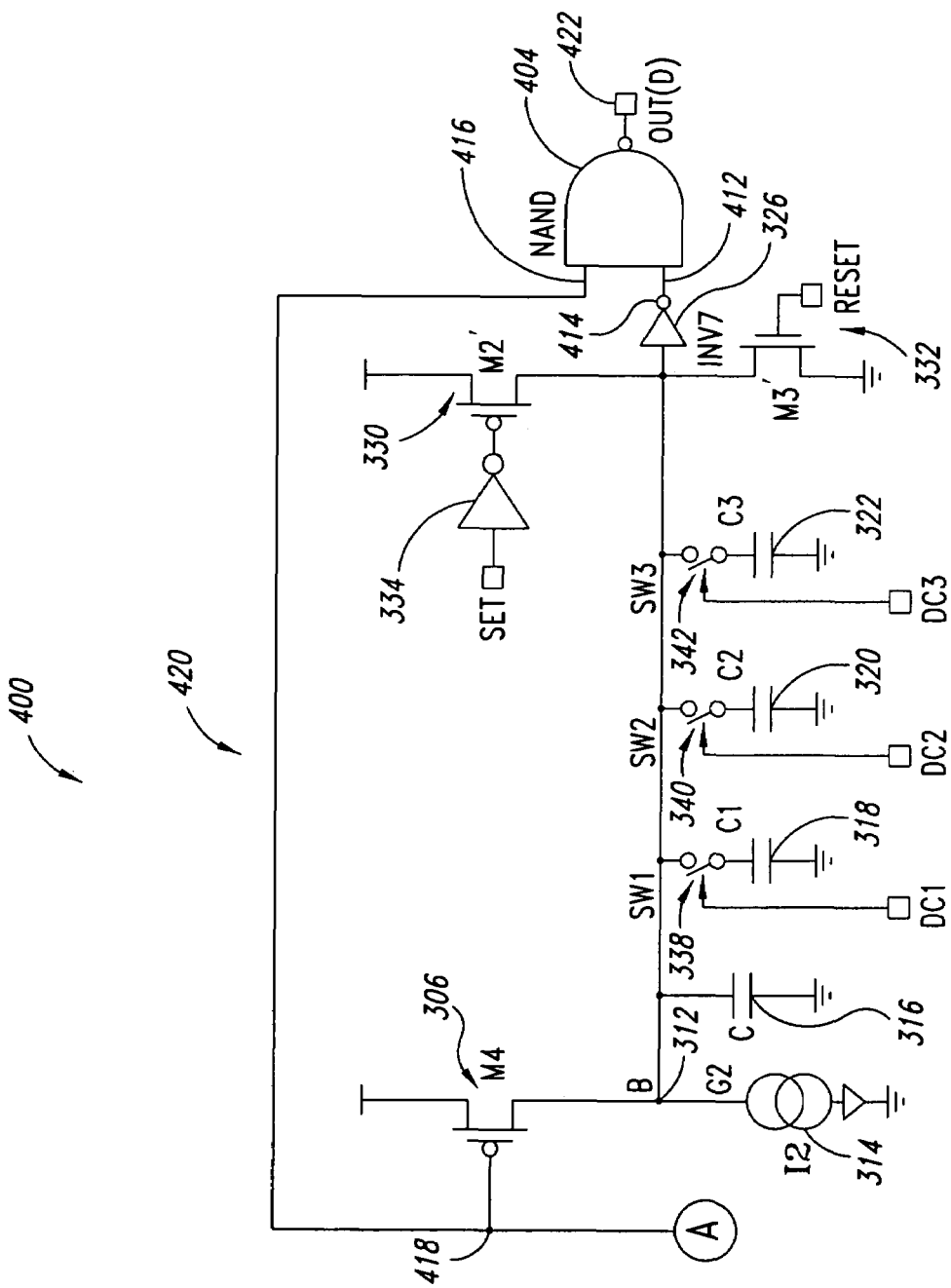

FIGS. 14A and 14B (collectively FIG. 14) show a variant 400 of the delay-time circuit of FIG. 13 that reduces noise that the oscillator containing the delay-time circuit may induce in the supply voltages. It is well known that an oscillator realized in an integrated circuit that contains analog circuits can cause interference in the supply voltages of the analog circuits. This interference is proportional to the currents in play. The delay time of each of the delay elements utilized in the oscillator may be the briefest possible at a predetermined edge of the input pulse. Once the capacitance of the capacitors has been fixed, a reduction of this delay time can be achieved by diminishing the resistance in conduction of the transistors (M1, M4) through which the capacitors are discharged. However, a low resistance implies a large discharge current and therefore considerable interference. The variant of the delay-time circuit shown in FIG. 14 maintains the resistance of the transistors at a relatively high value, thus avoiding high current peaks, while yet obtaining brief delay time.

The circuit of FIG. 14 differs from the one of FIG. 13 by virtue of the fact that the place of the inverters INV8 and INV9 is taken by, respectively, a NOR gate 402 and a NAND gate 404. The NOR gate 402 has a first input 406 connected to the output of the inverter INV6 212 and a second input 408 connected to the input 236 of the first stage 410, i.e., the input terminal IN(D) 236 of the circuit 400. The NAND gate 404 has a first input 412 connected to the output 414 of the inverter INV7 326 and a second input 416 connected to the input 418 of the second stage 420, i.e., the gate terminal of the transistor M4 306. As regards the functioning, when IN(D) 236 switches to 1, the transistor M1 230 goes from blocking to conducting, so that the capacitors (i.e., 202, 204, 206, 208) connected to the node A 214 begin to discharge through it. Before the discharge is completed, however, the switching of the input signal forces the output OUT(D) 422 to 1. In fact, the logic constituted by the NOR gate 402 and the NAND gate 404 transmits the switching of the input to the output before the capacitors become charged/discharged. The discharging/ charging processes should be concluded in a time shorter than the half-period of the oscillation.

Figure 15A:
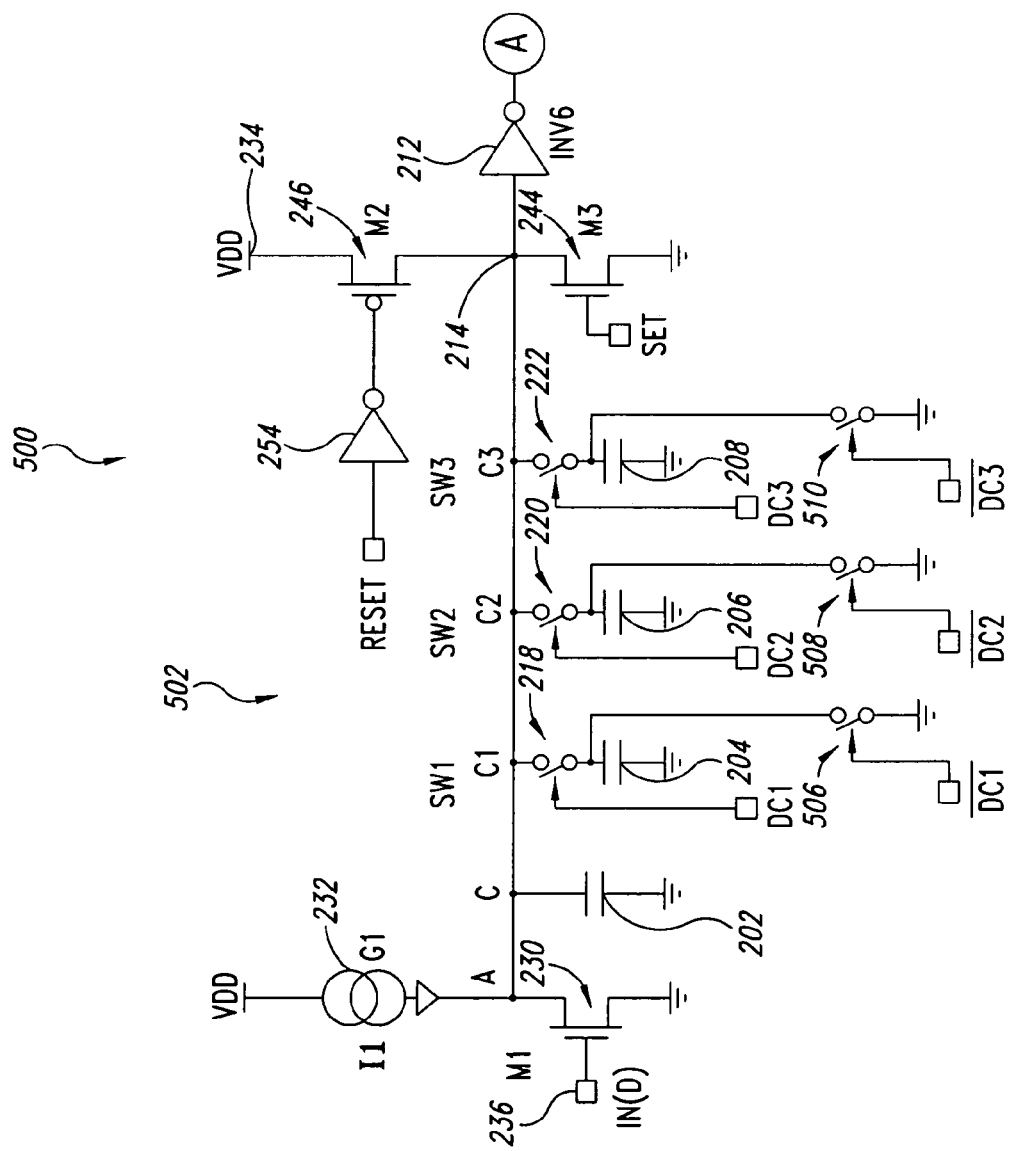
FIGS. 15A and 15B show a further embodiment of a time-delay circuit in accordance with the invention.
Figure 15B:
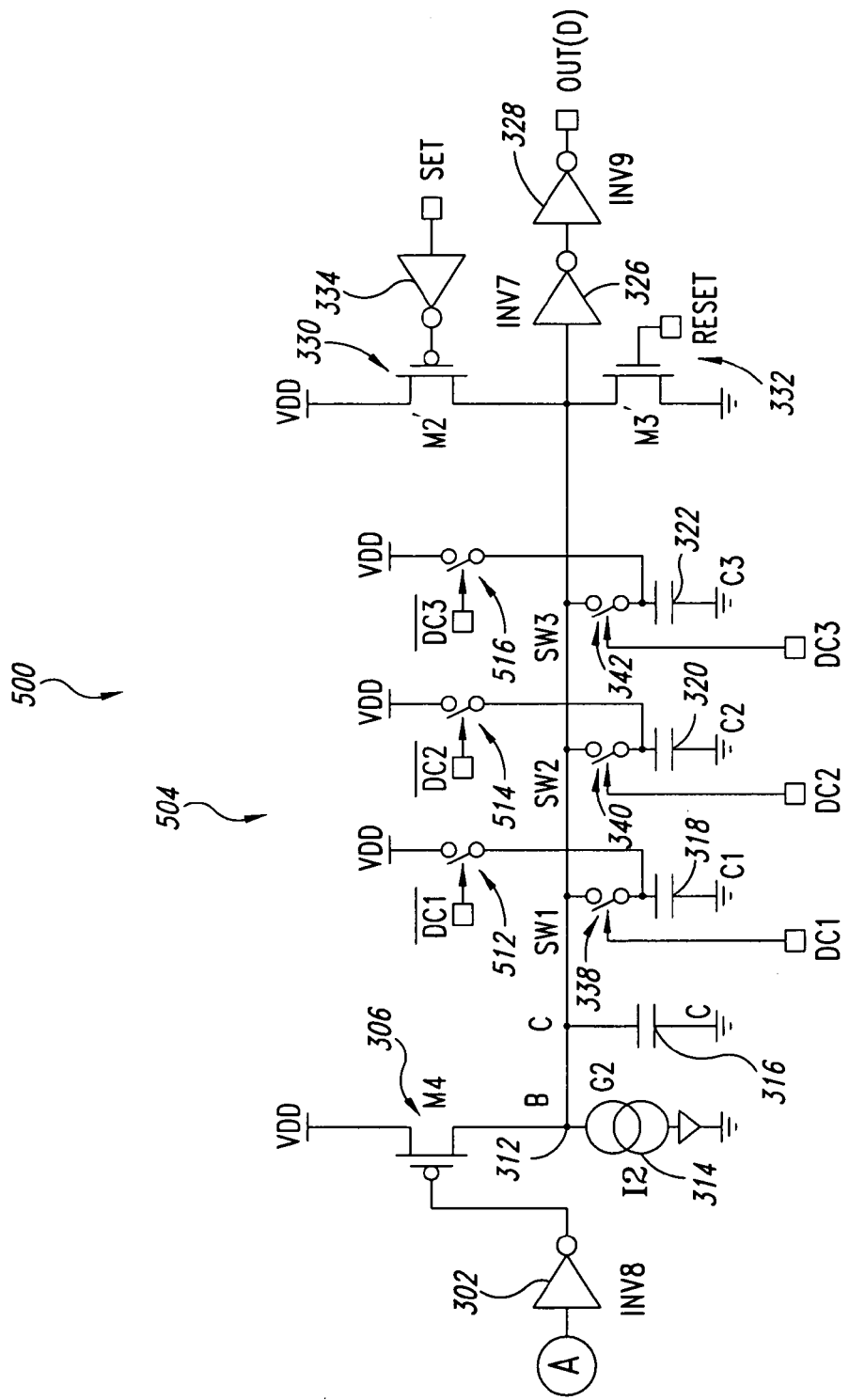

FIG. 15 shows a variant 500 of the delay-time circuit of FIG. 13 that facilitates modifying the duty cycle and or the period of the output signal during the functioning of the generator. If the contribution of each capacitor is to be the same whenever the respective electronic switch is closed, initial charging conditions should be the same. Consequently, the capacitors of the input stage 502 (i.e., 202, 204, 206, 208) are maintained at ground potential when they are not connected to the node A 214 and the capacitors of the output stage 504 (i.e., 316, 318, 320, 322) are maintained at VDD when they are not connected to the node B 312, utilizing electronic switches 506, 508, 510, 512, 514, 516 controlled by the negated values of the binary signal DC1, DC2, DC3. The variants illustrated in FIGS. 14 and 15 may be combined and dual or complementary variants may be employed.

Thus, delay-time circuits that can be realized in accordance with embodiments of the invention make it possible to obtain delay times that are independent of the variation of the manufacturing parameters and the operating temperatures, or depend on them only to a negligible extent, in a simple manner and with a minimum occupation of the integration area.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A time-delay circuit, comprising
an input terminal and an output terminal;
a first stage having:
  a first inverter having a switching threshold voltage;
  a first capacitor coupled to an input terminal of the first inverter; and
  means for controlling a charge of the first capacitor capable of responding to a predetermined edge of a input pulse applied to the input terminal of the circuit by bringing the input terminal of the first inverter from a first predetermined voltage to the switching threshold voltage and obtaining on an output terminal of the first inverter a pulse having an edge that, as referred to the predetermined edge of the input pulse, has a first delay time;
a second stage electrically complementary to the first stage and having:
  an input terminal and an output terminal coupled to the output terminal of the circuit;
  a second inverter having a switching threshold voltage substantially equal to that of the first inverter and an output terminal that is the output terminal of the stage;
  a second capacitor coupled to an input terminal of the second inverter; and
  means for controlling a charge of the second capacitor capable of responding to the edge of the pulse present on the output terminal of the first inverter by bringing the input terminal of the second inverter from a second predetermined voltage to the switching threshold voltage and obtaining on the output terminal of the second inverter a pulse having an edge that, as referred to the edge of the output pulse of the first inverter, has a second delay time, an overall delay of the circuit being a sum of the first and the second delay time; and
a third inverter coupled between the output terminal of the first inverter and the input terminal of the second inverter, wherein
  the means for controlling the charge of the first capacitor comprise a first constant current generator and a first controlled electronic switch connected in series with each other between a first and a second supply terminal of the circuit, said first controlled electronic switch having a control terminal connected to the input terminal of the circuit; and
  the means for controlling the charge of the second capacitor comprise a second constant current generator and a second controlled electronic switch connected in series with each other between the second and the first supply terminal, said second controlled electronic switch having its control terminal connected to the output terminal of the third inverter.

2. A time-delay circuit in accordance with claim 1 wherein a ratio between a capacitance of the first capacitor and a current of the first generator is substantially equal to a ratio between a capacitance of the second capacitor and a current of the second generator.

3. A time-delay circuit in accordance with claim 2 wherein the first capacitor and the second capacitor have substantially the same capacitance and the first generator and the second generator generate substantially equal currents.

4. A time-delay circuit in accordance with claim 1 wherein the first and the second controlled electronic switches comprise, respectively, an N-channel MOS transistor and a P-channel MOS transistor.

5. The time-delay circuit of claim 1, further comprising a third capacitor coupled to the input terminal of the first inverter through a first switch and a fourth capacitor coupled to the input terminal of the second inverter through a second switch.

6. The time-delay circuit of claim 1 wherein the overall delay time of the circuit is independent of the switching threshold voltages of the inverters.

7. A time-delay circuit, comprising:
an input terminal and an output terminal;
a first stage having:
  a first inverter having a switching threshold voltage;
  a first capacitor coupled to an input terminal of the first inverter; and
  means for controlling a charge of the first capacitor capable of responding to a predetermined edge of a input pulse applied to the input terminal of the circuit by bringing the input terminal of the first inverter from a first predetermined voltage to the switching threshold voltage and obtaining on an output terminal of the first inverter a pulse having an edge that, as referred to the predetermined edge of the input pulse, has a first delay time;

a second stage electrically complementary to the first stage and having:
  an input terminal and an output terminal coupled to the output terminal of the circuit;
  a second inverter having a switching threshold voltage substantially equal to that of the first inverter and an output terminal that is the output terminal of the stage;
  a second capacitor coupled to an input terminal of the second inverter; and
  means for controlling a charge of the second capacitor capable of responding to the edge of the pulse present on the output terminal of the first inverter by bringing the input terminal of the second inverter from a second predetermined voltage to the switching threshold voltage and obtaining on the output terminal of the second inverter a pulse having an edge that, as referred to the edge of the output pulse of the first inverter, has a second delay time, an overall delay of the circuit being a sum of the first and the second delay time; and
a third inverter coupled between the output terminal of the first inverter and the input terminal of the second inverter, wherein
  the means for controlling the charge of the first capacitor comprise a first resistor and a first controlled electronic switch connected in series with each other between a first and a second supply terminal of the circuit, said first controlled electronic switch having a control terminal connected to the input terminal of the circuit; and
  the means for controlling the charge of the second capacitor comprise a second resistor and a second controlled electronic switch connected in series with each other between the second and the first supply terminal, said second controlled electronic switch having its control terminal connected to the output terminal of the third inverter.

8. A time-delay circuit in accordance with claim 7 wherein the first capacitor and the second capacitor have substantially a same capacitance and the first resistor and the second resistor have substantially a same resistance.

9. The time-delay circuit of claim 7 wherein the first and the second controlled electronic switches comprise, respectively, an N-channel MOS transistor and a P-channel MOS transistor.

10. A time delay logic, comprising:
a first stage having:
  a first inverting logic; and
  means for triggering a delayed response of the first inverting logic to an input signal; and
a second stage having:
  a second inverting logic; and
  means for triggering a delayed response of the second inverting logic to an output of the first stage, the means for triggering a delayed response of the second inverting logic being electrically complementary to the means for triggering a delayed response of the first inverting logic, wherein the means for triggering the delayed response of the first inverting logic comprises:
  a constant current generator coupled between a first reference voltage and a first node;
  a transistor coupled between the first node and a second reference voltage; and
  first capacitive means coupled between the first node and the second reference voltage.

11. The time delay logic of claim 10 wherein the first inverting logic comprises an inverter.

12. The time-delay logic of claim 11 wherein an overall delay time of the logic is independent of a switching threshold of the inverter.

13. The time delay logic of claim 10 wherein the means for triggering the delayed response of the first inverting logic is configured to trigger a delayed response to a leading edge of the input signal and to produce a substantially undelayed response to a trailing edge of the input signal.

14. The time delay logic of claim 10 wherein the means for triggering the delayed response of the second inverting logic comprises:
  a constant current generator coupled between the second reference voltage and a second node;
  a transistor coupled between the second node and the first reference voltage; and
  second capacitive means coupled between the second node and the second reference voltage.

15. The time delay logic of claim 14 wherein the first capacitance means comprises a first plurality of capacitors selectively coupled to the first node through a corresponding first plurality of switches and the second capacitive means comprises a second plurality of capacitors selectively coupled to the second node through a corresponding second plurality of switches.

16. The time delay logic of claim 15 wherein the first plurality of capacitors are selectively coupled to the second reference voltage through a corresponding third plurality of switches.

17. The time delay logic of claim 10, further comprising:
  a third inverting logic coupled between the first inverting logic and the output of the first stage.

18. The time delay logic of claim 10, further comprising:
  a third inverting logic coupled between the second inverting logic and an output of the second stage.

19. The time delay logic of claim 10, further comprising:
  a first logic gate coupled between the first stage and the second stage; and
  a second logic gate coupled between the second inverting logic and an output of the time delay logic.

20. A time delay logic, comprising:
a first stage having:
  a first inverting logic; and
  means for triggering a delayed response of the first inverting logic to an input signal; and
a second stage having:
  a second inverting logic; and
  means for triggering a delayed response of the second inverting logic to an output of the first stage, the means for triggering a delayed response of the second inverting logic being electrically complementary to the means for triggering a delayed response of the first inverting logic, wherein the means for triggering the delayed response of the first inverting logic comprises:
  a first resistor coupled between a first reference voltage and a first node;
  a transistor coupled between the first node and a second reference voltage; and
  first capacitive means coupled between the first node and the second reference voltage.

21. A time delay logic, comprising:
a first stage having:
  a first inverting logic; and
  means for triggering a delayed response of the first inverting logic to an input signal;

a second stage having:
    a second inverting logic; and
    means for triggering a delayed response of the second inverting logic to an output of the first stage, the means for triggering a delayed response of the second inverting logic being electrically complementary to the means for triggering a delayed response of the first inverting logic;
  a first logic gate coupled between the first stage and the second stage and having a first input coupled to the input of the time delay circuit, a second input coupled to an output of the first inverting logic and an output coupled to an input of the second stage; and
  a second logic gate coupled between the second inverting logic and an output of the time delay logic and having a first input coupled to an output of the first logic gate, a second input coupled to an output of the second inverting logic and an output.

22. A system comprising:
  a first delay stage having:
    a first inverting logic; and
    a first input stage configured to delay a response of the first inverting logic to an input signal; and
  a second delay stage having:
    a second inverting logic; and
    a second input stage electrically complementary to the first input stage and configured to delay a response of the second inverting logic to an output of the first delay stage, wherein the first input stage comprises:
      a constant current generator coupled between a first reference voltage and a first node;
      a transistor coupled between the first node and a second reference voltage; and
      a capacitor coupled between the first node and the second reference voltage.

23. The system of claim 22 wherein an overall delay of the first and second delay stages is independent of switching threshold voltages of the first and second inverting logics.

24. A system comprising:
  a first delay stage having:
    a first inverting logic; and
    a first input stage configured to delay a response of the first inverting logic to an input signal; and
  a second delay stage having:
    a second inverting logic; and
    a second input stage electrically complementary to the first input stage and configured to delay a response of the second inverting logic to an output of the first delay stage, wherein the first input stage comprises:
      a constant current generator coupled between a first reference voltage and a first node;
      a transistor coupled between the first node and a second reference voltage; and
      a capacitor coupled between the first node and the first reference voltage.

25. A system comprising:
  a first delay stage having:
    a first inverting logic; and
    a first input stage configured to delay a response of the first inverting logic to an input signal; and
  a second delay stage having:
    a second inverting logic; and
    a second input stage electrically complementary to the first input stage and configured to delay a response of the second inverting logic to an output of the first delay stage, wherein the first input stage comprises
      a first resistor coupled between a first reference voltage and a first node;
      a transistor coupled between the first node and a second reference voltage; and
      a capacitor coupled between the first node and the second reference voltage.

26. A system comprising:
  a first delay stage having:
    a first inverting logic; and
    a first input stage configured to delay a response of the first inverting logic to an input signal; and
  a second delay stage having:
    a second inverting logic; and
    a second input stage electrically complementary to the first input stage and configured to delay a response of the second inverting logic to an output of the first delay stage, wherein the first input stage comprises
      a first resistor coupled between a first reference voltage and a first node;
      a transistor coupled between the first node and a second reference voltage; and
      a capacitor coupled between the first node and the first reference voltage.

* * * * *